US012094763B2

(12) United States Patent
Yew et al.

(10) Patent No.: US 12,094,763 B2
(45) Date of Patent: Sep. 17, 2024

(54) METAL-INSULATOR-METAL CAPACITOR (MIMCAP) AND METHODS OF FORMING THE SAME

(71) Applicant: GLOBALFOUNDRIES Singapore Pte. Ltd., Singapore (SG)

(72) Inventors: Kwang Sing Yew, Singapore (SG); Ramasamy Chockalingam, Singapore (SG); Juan Boon Tan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 316 days.

(21) Appl. No.: 17/467,477

(22) Filed: Sep. 7, 2021

(65) Prior Publication Data
US 2023/0069830 A1   Mar. 9, 2023

(51) Int. Cl.
*H01L 27/08*   (2006.01)
*H01L 21/768*   (2006.01)
*H01L 23/522*   (2006.01)
*H01L 49/02*   (2006.01)

(52) U.S. Cl.
CPC .. *H01L 21/76811* (2013.01); *H01L 21/76832* (2013.01); *H01L 21/76843* (2013.01); *H01L 23/5223* (2013.01); *H01L 23/5226* (2013.01); *H01L 27/0805* (2013.01); *H01L 28/40* (2013.01)

(58) Field of Classification Search
CPC ......... H01L 28/40; H01L 28/60; H01L 28/75; H01L 28/90; H01L 28/91; H01L 21/76811; H01L 21/76832; H01L 21/76843; H01L 27/0805
See application file for complete search history.

(56) References Cited

U.S. PATENT DOCUMENTS

| | | | |
|---|---|---|---|
| 6,320,244 B1 * | 11/2001 | Alers | H10B 12/03 257/532 |
| 6,624,040 B1 | 9/2003 | Ng et al. | |
| 6,767,788 B2 * | 7/2004 | Kim | H01L 21/76843 257/E21.582 |
| 7,220,652 B2 * | 5/2007 | Kim | H01L 28/40 438/386 |
| 7,796,372 B2 | 9/2010 | Cremer et al. | |
| 8,716,100 B2 * | 5/2014 | Tzeng | H01L 28/40 438/396 |
| 2003/0143322 A1 | 7/2003 | Ning | |
| 2013/0069199 A1 | 3/2013 | Adkisson et al. | |
| 2020/0135845 A1 | 4/2020 | Seidel et al. | |

* cited by examiner

Primary Examiner — Eduardo A Rodela
(74) Attorney, Agent, or Firm — VIERING JENTSCHURA & PARTNER MBB (57) ABSTRACT

A device may include a first conductive element and an interlevel dielectric arranged over the first conductive element. The device may further include a dual damascene opening including a first end, a second end, and sidewalls extending between the first and second ends, the sidewalls extending through the interlevel dielectric. A metal-insulator-metal (MIM) stack may line the dual damascene opening. The MIM stack may include a first conductive liner lining the sidewalls and the second end of the dual damascene opening, an insulator layer lining the first conductive liner, and a second conductive liner lining the insulator layer. A first metal interconnect may be disposed in and filling the dual damascene opening lined with the MIM stack.

20 Claims, 12 Drawing Sheets

METAL-INSULATOR-METAL CAPACITOR (MIMCAP) AND METHODS OF FORMING THE SAME

TECHNICAL FIELD

The present disclosure relates generally to integrated circuits, and more particularly to metal-insulator-metal capacitors (MIMCAPs) and methods of forming the same.

BACKGROUND

MIMCAPs embedded in conventional BEOL integrated circuits generally have a two-dimensional structure (i.e., horizontal) which includes two metal plates that sandwich a dielectric parallel to the wafer surface. For example, MIMCAPs may be formed between horizontal metallization layers in the BEOL in additional horizontal layers, with each plate requiring a separate pattern and etch level. However, horizontal MIMCAPs require a relatively large amount of surface area on a semiconductor wafer. For example, in some conventional devices, a horizontal MIMCAP may be arranged parallel to the wafer surface covering a large area of the chip, and therefore, do not provide a high area efficiency.

It is desirable to provide devices with improved capacity of MIMCAPs in the metallization layer which fully utilize the chip area efficiently and methods of forming thereof.

SUMMARY

According to various embodiments, a device may include a first conductive element and an interlevel dielectric arranged over the first conductive element. A dual damascene opening may extend through the interlevel dielectric. The dual damascene opening may include a first end, a second end, and sidewalls extending between the first and second ends, the sidewalls extending through the interlevel dielectric. A metal-insulator-metal (MIM) stack may line the dual damascene opening. The MIM stack may include a first conductive liner lining the sidewalls and the second end of the dual damascene opening, an insulator layer lining the first conductive liner, and a second conductive liner lining the insulator layer. A first metal interconnect may be disposed in and filling the dual damascene opening lined with the MIM stack.

According to various embodiments, a method of forming a device is provided. The method may include providing an interlevel dielectric arranged over a first conductive element, forming a dual damascene opening through the interlevel dielectric, the dual damascene opening including a first end, a second end, and sidewalls extending between the first and second ends, the sidewalls extending through the interlevel dielectric, and forming a metal-insulator-metal (MIM) stack in the dual damascene opening. Forming the MIM stack may include forming a first conductive liner to line the sidewalls and the second end of the dual damascene opening, forming an insulator layer to line the first conductive liner, and forming a second conductive liner to line the insulator layer. A first metal interconnect may be formed in and filling the dual damascene opening lined with the MIM stack.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following.

DETAILED DESCRIPTION

The following detailed description refers to the accompanying drawings that show, by way of illustration, specific details and embodiments in which the embodiments may be practiced. These embodiments are described in sufficient detail to enable those skilled in the art to practice the embodiments. Other embodiments may be utilized and structural, logical, and electrical changes may be made without departing from the scope of the invention. The various embodiments are not necessarily mutually exclusive, as some embodiments can be combined with one or more other embodiments to form new embodiments.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Embodiments of the present disclosure generally relate to a device having a metal-insulator-metal capacitor (MIMCAP) structure with increased capacitance density. The MIMCAP may have a three-dimensional vertical structure. According to various embodiments, the MIM capacitor structure may be integrated with logic devices in an integrated circuit (IC). The devices or ICs may be incorporated into or used with, for example, consumer electronic products, or relate to other types of devices.

Figure 1A:
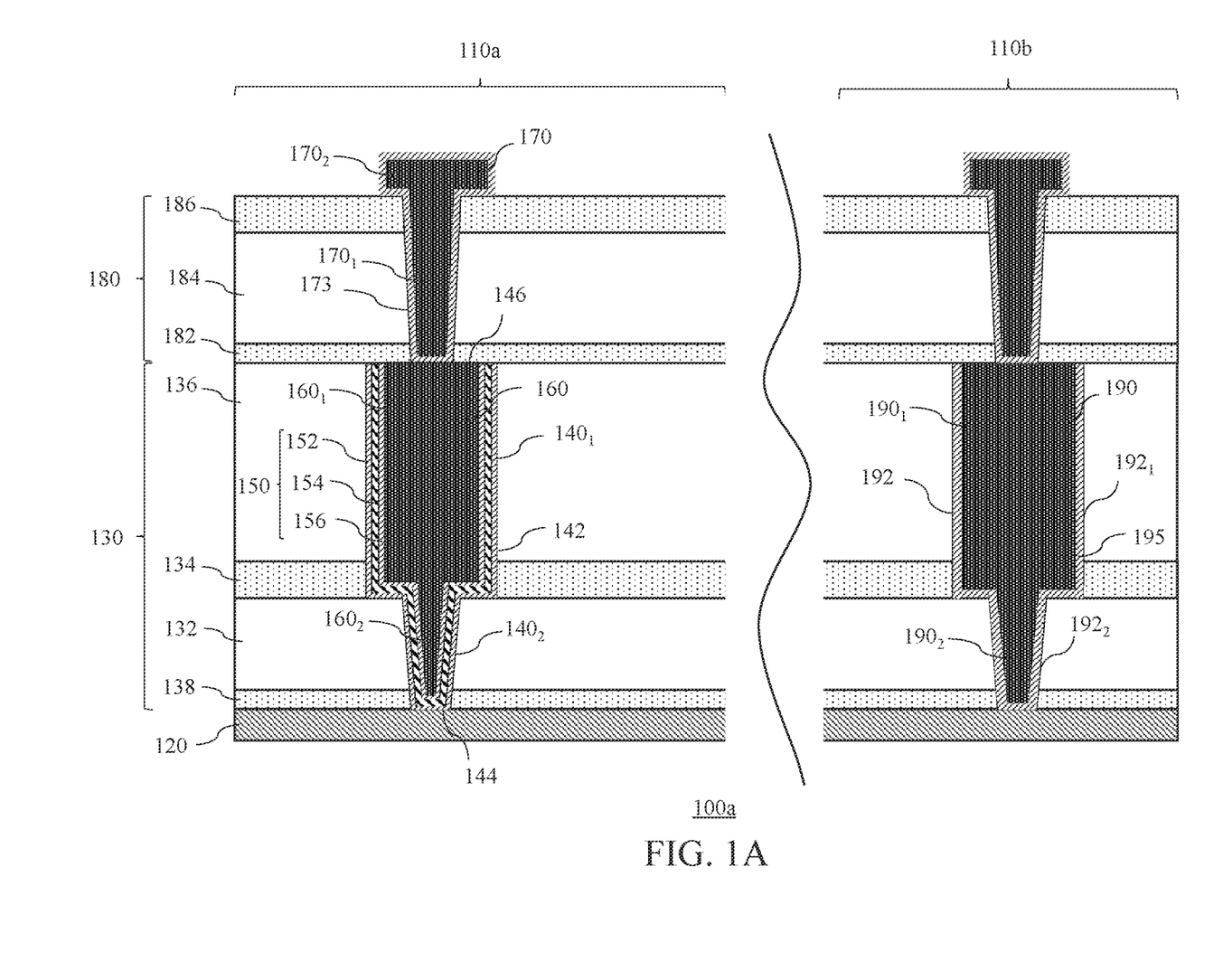
FIGS. 1A-1B show cross-sectional views of various embodiments of a device.
Figure 1B:
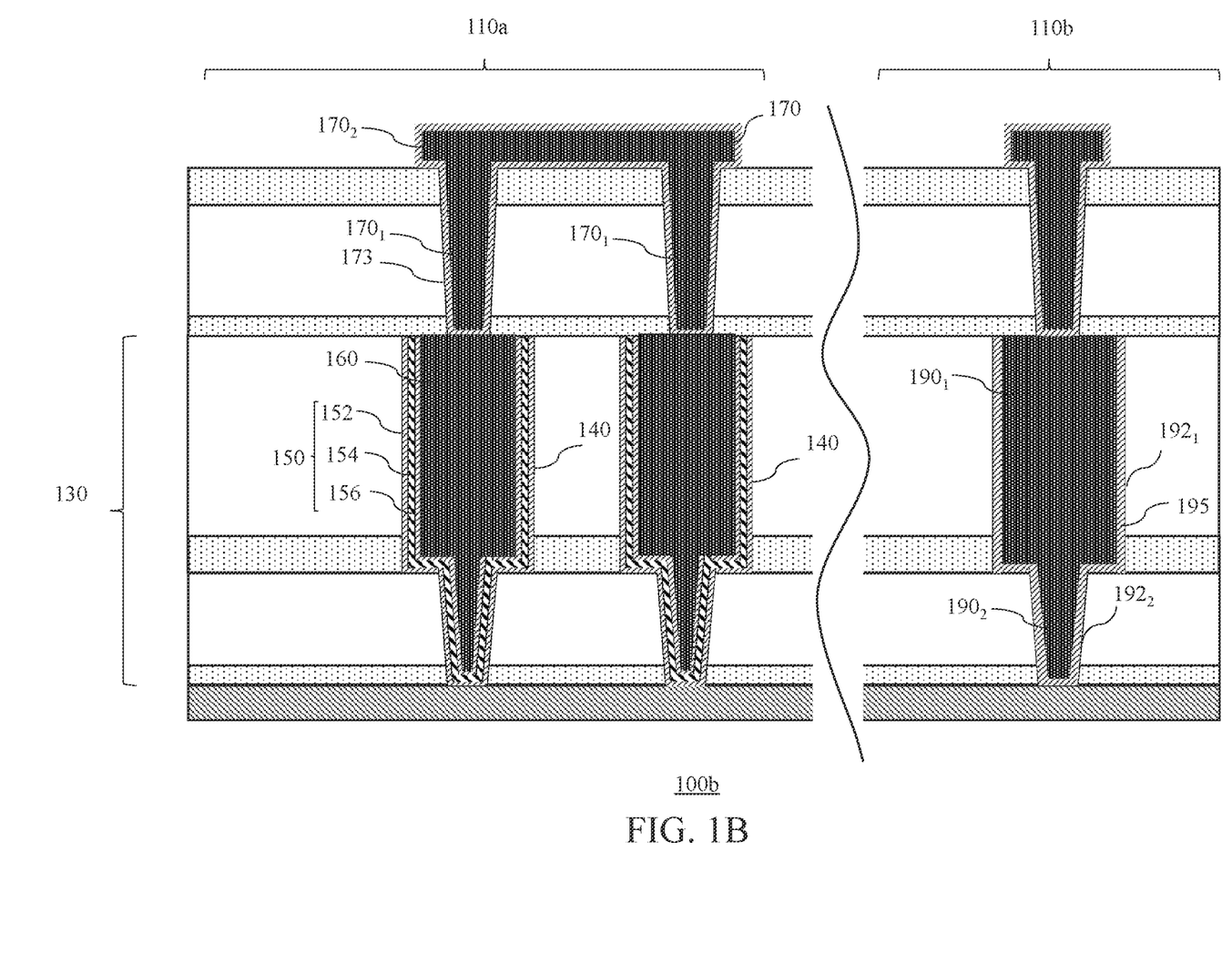

FIG. 1A shows an exemplary cross-sectional view of an embodiment of a device 100a, while FIG. 1B shows an exemplary cross-sectional view of an embodiment of a device 100b. For example, the device (e.g., 100a, 100b) may be an IC having a first region 110a and a second region 110b. The IC may also include other types of device regions (not shown). In the interest of brevity and for purposes of clarity, some of the reference numerals indicated in FIG. 1A may not be indicated in FIG. 1B. According to various embodiments, the first region 110a may include one or more capacitors disposed in an interlevel dielectric of the IC as will be described, while the second region 110b may include logic components. The capacitors, for example, may be metal-insulator-metal capacitors (MIMCAPs). FIG. 1A illustrates the device 100a having a single capacitor in the interlevel dielectric in the first region 110a, while FIG. 1B illustrates the device 100b having a plurality of capacitors (e.g., two capacitor structures are illustrated) in the interlevel dielectric in the first region 110a.

The device may include a substrate (not shown in the interest of brevity). The substrate may be a semiconductor substrate, such as a silicon substrate. Other types of substrates, such as silicon germanium, germanium, gallium arsenide, or crystal-on-insulator (COI) such as silicon-on-insulator (SOI), may also be used. Electronic components (not illustrated) may be formed over and/or within the substrate. The electronic components may include, for example, transistors, capacitors, resistors, and diodes. Other types of components may also be disposed over and/or within the substrate. The substrate may include isolation regions such as shallow trench isolation (STI) regions (not shown). The isolation regions, for example, isolates the first region 110a and second region 110b as well as other device regions. Other configurations of isolation regions may also be useful.

A metallization layer or interlevel dielectric (ILD) may be arranged over the substrate. For example, the metallization layer may be formed over the components on the substrate. For example, the metallization layer may be formed in the first region 110a and the second region 110b. The metallization layer may include a plurality of ILD layers. For example, the metallization layer may include a plurality of ILD levels. The number of ILD levels may depend on, for example, design requirements or the logic process involved. The metallization layer, for example, may be formed by back-end-of-line (BEOL) processing. The ILD layers of the metallization layer, for example, may be formed of one or more dielectric materials, such as low-k dielectric (e.g., SiCOH), silicon oxide, silicon nitride, etc. The dielectric layers may be formed by chemical vapor deposition (CVD). Other suitable material and techniques for forming the ILD layers may also be useful.

The metallization layer may include interconnects disposed in the ILD layers (not fully illustrated in the interest of brevity). The interconnects connect the various components of the IC to perform the desired functions. For example, an ILD level may include a metal level and a contact level in the first and second regions 110a and 110b. For example, a metal level includes conductors or metal lines while the contact level includes via contacts (not shown). It is understood that there may be a plurality of metal lines in the same metal level of the first and second regions 110a and 110b. The metal lines and contacts may be formed of a metal, such as copper (Cu), copper alloy, aluminum (Al), tungsten (W) or a combination thereof. Other suitable types of metal, alloys or conductive materials may also be useful. In some cases, the conductors and contacts may be formed of the same material. For example, in upper levels of the metallization layer, the metal lines and via contacts may be formed by dual damascene processes. This results in the metal lines and contacts having the same material. In some cases, the metal lines and contacts may have different materials. For example, in the case where the contacts and metal lines are formed by single damascene processes, the materials of the metal lines and via contacts may be different.

The metallization layer may include a first conductive element (or layer or film) 120. For example, the first conductive element may be a metal line $M_x$ disposed in ILD level x, where x is an integer number. For example, the first conductive element 120 may be coupled to other interconnects of the metallization layer.

According to various embodiments, the device 100a, 100b may include an interlevel dielectric 130 (which may be interchangeably referred to as a first interlevel dielectric herein) arranged over the substrate. The interlevel dielectric 130 may be arranged over the first conductive element 120. The interlevel dielectric 130, for example, may correspond to any ILD level, such as an ILD level above thin wire(s), of the metallization layer. For example, in the case the first conductive element (or the metal line) 120 is arranged in ILD level x, the interlevel dielectric 130 may correspond to ILD level x+1.

According to various embodiments, the interlevel dielectric 130 may include a first interlevel dielectric layer 132, an etch stop layer (or first etch stop layer) 134 disposed on the first interlevel dielectric layer 132, and a second interlevel dielectric layer 136 disposed on the etch stop layer 134. The etch stop layer 134 may be formed of a dielectric material having different etch rate and/or different etch selectivity with respect to dielectric material of the second interlevel dielectric layer 136. The etch stop layer 134 may have lower etch rate and different etch selectivity relative to the second interlevel dielectric layer 136.

According to various embodiments, the interlevel dielectric 130 may further include a second etch stop layer 138 on which the first interlevel dielectric layer 132 may be disposed. The interlevel dielectric 130 may include the second etch stop layer 138, for example in the case where the first conductive element 120 is formed of Cu, so as to protect Cu from oxidation and protect from diffusion of Cu into the first interlevel dielectric layer 132 such as tetraethyl orthosilicate (TEOS). The second etch stop layer 138 may have lower etch rate relative to the first interlevel dielectric layer 132. The etch stop layer 134 and the second etch stop layer 138, for example, may be formed of silicon nitride (SiN). Other suitable types of materials for the etch stop layer 134 and the second etch stop layer 138, such as carbon-doped silicon nitride (SiCN), may also be useful. In other embodiments, the second etch stop layer 138 is not formed.

The first interlevel dielectric layer 132 and the second interlevel dielectric layer 136 may be formed of tetraethyl orthosilicate (TEOS), fluorinated TEOS (FTEOS), silicon oxide, other low-k dielectric materials. Other suitable types of dielectric materials are also useful.

According to various embodiments, the second interlevel dielectric layer 136 and the etch stop layer 134 may have a thickness to accommodate an ultra thick metal as will be described later. According to various embodiments, the second interlevel dielectric layer 136 may have a thickness ranging from about 0.9 μm to about 4.0 μm. According to various embodiments, the second interlevel dielectric layer 136 may have a thickness of about 3.3 μm.

According to various embodiments, the etch stop layer 134 may have a thickness ranging from about 0.05 μm to about 0.2 μm. According to various embodiments, the etch stop layer 134 may have a thickness of about 0.18 μm.

According to various embodiments, the first interlevel dielectric layer 132 may have a thickness ranging from about 0.4 μm to about 0.8 μm. According to various embodiments, the first interlevel dielectric layer 132 may have a thickness of about 0.57 μm.

As for the second etch stop layer 138, it may have a thickness depending on the metal stack configuration and etch margin. According to various embodiments, the second etch stop layer 138 may have a thickness ranging from about 0.05 µm to about 0.2 µm. According to various embodiments, the second etch stop layer 138 may have a thickness of about 0.08 µm.

A dual damascene opening 140 may extend through the interlevel dielectric 130. As illustrated in FIGS. 1A-1B, the dual damascene opening 140 may have a first end (e.g., top) 146, a second end (e.g., bottom) 144, and sidewalls 142. The sidewalls 142 extend between the first end 146 and the second end 144 through the interlevel dielectric 130. The first conductive element 120 may be disposed below the dual damascene opening. The bottom or second end 144 of the dual damascene opening 140 may partially expose a top surface of the first conductive element 120.

The dual damascene opening may include a trench opening 1401 and a via opening 1402. According to various embodiments, the trench opening 1401 may extend through the second interlevel dielectric layer 136 and the etch stop layer 134. The via opening 1402 may extend through the first interlevel dielectric layer 132. The via opening 1402 may partially expose a top surface of the first conductive element 120. In the case where the interlevel dielectric 130 further includes the second etch stop layer 138, the via opening 1402 may further extend through the second etch stop layer 138 to partially expose the top surface of the first conductive element 120. According to various embodiments, the trench opening 1401 may have a width (e.g. diameter) of about 1.5 µm or greater. According to various embodiments, the via opening 1402 may have a width (e.g., diameter) of about 0.3 µm.

According to various embodiments, a metal-insulator-metal (MIM) stack 150 may line the dual damascene opening 130. The MIM stack 150 may include a first conductive liner 152 lining the sidewalls 142 and the second end 144 of the dual damascene opening, an insulator layer 154 lining the first conductive liner 152, and a second conductive liner 156 lining the insulator layer 154. The first conductive liner 152, the insulator layer 154 and the second conductive liner 156 may be conformal to a topography of the trench opening 1401 and the via opening 1402. The first conductive liner 152 of the MIM stack 150 may cover and contact the top surface of the first conductive element 120. The first conductive liner 152 and the second conductive liner 156 may have a thickness of about 0.005 µm to about 0.08 µm. The insulator layer 154 of the MIM stack may have a thickness of about 0.015 µm to about 0.1 µm, in a non-limiting example.

The first conductive liner 152 may serve as a first (e.g., bottom) electrode of the MIM stack, while the second conductive liner 156 may serve as a second (e.g., top) electrode of the MIM stack. The first conductive liner 152 and the second conductive liner 156 may be formed of a conductive material. For example, the first conductive liner 152 and the second conductive liner 156 may each be formed of one or more layers of tantalum (Ta), titanium (Ti), tantalum nitride (TaN) and titanium nitride (TiN), or combinations thereof. For example, the first conductive liner 152 may be formed of TaN/Ta, TaN/TIN, TaN/Ta/TaN/TiN, etc. For example, the second conductive liner 156 may be formed of TiN/TaN/Ta, TiN/Ta, etc. The insulator layer 154 of the MIM stack 150 may be formed of a dielectric material such as silicon nitride (SiN), silicon oxide (SiO), HfOx, AlOx and other high-k dielectric films, in a non-limiting example.

A first metal interconnect 160 may be disposed in and fills the MIM stack lined dual damascene opening. The first metal interconnect 160 and the interlevel dielectric 130 may have a substantially planar top surface. The first metal interconnect 160 may include a trench or metal line portion 1601 and a via or via contact portion 1602. According to various embodiments, the trench portion 1601 may be an ultra thick metal (UTM). The trench portion 1601 may have a thickness or depth of about 0.9 µm or greater. According to various embodiments, the trench portion 1601 may have a thickness or depth ranging from about 0.9 µm to about 4 µm. According to various embodiments, the trench portion 1601 may have a thickness or depth of about 3 µm. Accordingly, a portion of the MIM stack 150 may be embedded or arranged along sidewalls of the UTM (trench portion 1601). According to various embodiments, the via contact portion 1602 may have a thickness or depth ranging from about 0.4 µm to about 0.8 µm.

As illustrated in FIGS. 1A-1B, the MIM stack 150 may surround the first metal interconnect 160. The MIM stack 150 may include a first vertical portion, a first lateral portion extending from the first vertical portion, a second vertical portion extending from the first lateral portion, and a second lateral portion extending from the second vertical portion. The first vertical portion and the first lateral portion may be disposed in the trench portion 1601 of the dual damascene structure, while the second vertical portion and the second lateral portion may be disposed in the via contact portion 1602. The first vertical portion, the first lateral portion, the second vertical portion and the second lateral portion may be continuous.

Accordingly, the MIM stack 150, including a portion of the MIM stack 150 (e.g., disposed in the second interlevel dielectric layer 136 and the etch stop layer 134) surrounding the large ultra thick metal (trench portion 1601 having a thickness or depth of about 0.9 µm or greater), may advantageously provide increased or high capacitance density for the capacitor structure. In other words, the large vertical area covered by the MIM stack per horizontal area along the surface of the substrate provides an increased capacitance density. For example, in the case the insulator layer 154 arranged along the trench opening 1401 and the via opening 1402 has a thickness of 285 Å, with the trench portion 1601 having a thickness or depth of about 3 µm and a width (e.g., diameter) of about 1.5 µm and the via contact portion 1602 having a thickness or depth of about 0.5 µm and a width (e.g., diameter) of about 0.3 µm, the capacitor structure may have a density of about 18 fF/um$^2$.

A second conductive element 170 may be arranged over the first metal interconnect 160 and electrically coupled to the MIM stack 150. The second conductive element 170, for example, may be formed of two layers of ultra thick metal. In other embodiments, the second conductive element 170 may be a contact pad, such as an aluminum (Al) pad. According to various embodiments, the second conductive element 170 may be, or include a second via contact 1701 and a second metal line 1702 on the second via contact. The second metal line 1702 may be coupled to the MIM stack 150 through the second via contact 1701 and the first interconnect 160. For example, the second via contact 1701 may be arranged in a second via opening and the second metal line 1702 may be arranged in a second trench opening. A liner barrier 173 may be arranged to line sidewalls and a bottom of the second via opening and sidewalls and a bottom of the second trench opening, for example, to prevent metal diffusion, such as Cu in a non-limiting example, into the dielectric layer formed, for example, of oxide or TEOS. Other configurations of the second conductive element 170 may also be used.

The first conductive element 120, the first metal interconnect 160, and the second conductive element 170 may be formed of a conductive material. For example, the first conductive element 120, the first metal interconnect 160, and the second conductive element 170 may be formed of copper (Cu), Cu alloy, aluminum (Al), cobalt (Co), ruthenium (Ru) or tungsten (W). Other types of conductive material may also be useful.

The device (e.g., 100a, 100b) may further include a second interlevel dielectric 180 arranged over the interlevel dielectric 130. The second interlevel dielectric 180 may surround the second conductive element 170 (e.g., second via contact 1701) and covers a top surface of the MIM stack 150. The top surface of the MIM stack 150 may include exposed ends of the first conductive liner 152, the insulator layer 154 and the second conductive liner 156 after planarization such as polishing. According to various embodiments, the second interlevel dielectric 180 may include a third etch stop layer 182, a third interlevel dielectric layer 184 and a fourth etch stop layer 186. For example, the third etch stop layer 182 may be formed of SiCN, the third interlevel dielectric layer 184 may be formed of TEOS, and the fourth etch stop layer 186 may be formed of SiN. For example, the third etch stop layer 182 may have a thickness of about 0.08 μm, the third interlevel dielectric layer 184 may have a thickness of about 0.57 μm, and the fourth etch stop layer 186 may have a thickness of about 0.18 μm.

As described, the dual damascene opening having the MIM stack is disposed in the first region 110a of the interlevel dielectric 130. The interlevel dielectric 130 may further include the second region 110b adjacent to the first region. According to various embodiments, a logic interconnect 190 may be disposed in the interlevel dielectric 130 in the second region 110b. The logic interconnect 190 may include a trench or metal line portion 1901 and a via or via contact portion 1902. The logic interconnect 190 in the second region 110b may be formed of the same conductive material as the first metal interconnect 160 in the first region 110a. The logic interconnect 190 may be disposed in a dual damascene opening (e.g., second dual damascene opening) 192 for the logic interconnect which extends through the interlevel dielectric 130. Similar to the dual damascene opening 140 in the first region 110a, the second dual damascene opening 192 may include a trench opening 1921 and a via opening 1922. The trench opening 1921 of the second dual damascene opening 192 in the second region 110b may have the same depth as the trench opening 1401 of the dual damascene opening 140 in the first region 110a. The via opening 1922 of the second dual damascene opening 192 in the second region 110b may have the same depth as the via opening 1402 of the dual damascene opening 140 in the first region 110a. A conductive liner 195 may line sidewalls and bottom of the second dual damascene opening 192. Accordingly, the logic interconnect 190 may be disposed in and fills the second dual damascene opening 192 lined with the conductive liner 195. No insulator layer is disposed in the second dual damascene opening 192 for the logic interconnect in the second region 110b, unlike the dual damascene opening (first damascene opening) 140 in the first region 110a which accommodates the MIM stack 150.

Referring to FIG. 1B, the interlevel dielectric 130 includes a plurality of the dual damascene openings (which may interchangeably be referred to as first damascene openings) 140 in the first region 110a, each respective dual damascene opening having a respective MIM stack 150 and a respective first metal interconnect 160 disposed in the respective dual damascene opening. For example, the interlevel dielectric 130 includes two first dual damascene openings, each extending through the interlevel dielectric 130. Each of the first dual damascene openings may be lined with a respective MIM stack, providing a first capacitor structure and a second capacitor structure, respectively. Each of the first dual damascene openings may include a respective first metal interconnect 160 disposed in and filling the MIM stack lined first dual damascene opening. According to various embodiments, the first capacitor structure and the second capacitor structure may share a common second metal line 1702. The second metal line 1702 may be coupled to the respective MIM stack 150 (e.g., the first capacitor structure and the second capacitor structure) through the respective first metal interconnect 160 and a respective second via contact 1701. In other words, two second via contacts 1701 may extend from the common second metal line 1702. In other words, the first capacitor structure and a second capacitor structure may share a common second conductive element 170. Accordingly, in various embodiments, two MIM stacks (or the first capacitor structure and the second capacitor structure) may be coupled to a commonly biased second conductive element 170.

FIGS. 2A-2J show cross-sectional views of an embodiment of a process 200 for forming a device. The device, for example, is similar to that described in FIGS. 1A-1B. As such, common elements may not be described or described in detail. For purpose of illustration, the process 200 may be described with respect to forming two MIM capacitors, however, it understood that any number of MIM capacitors, including one MIM capacitor as described with respect to FIG. 1A, or a plurality of MIM capacitors may be formed. For example, the MIM capacitors may be formed in the metallization layer of the device or an IC using logic processing.

Figure 2A:
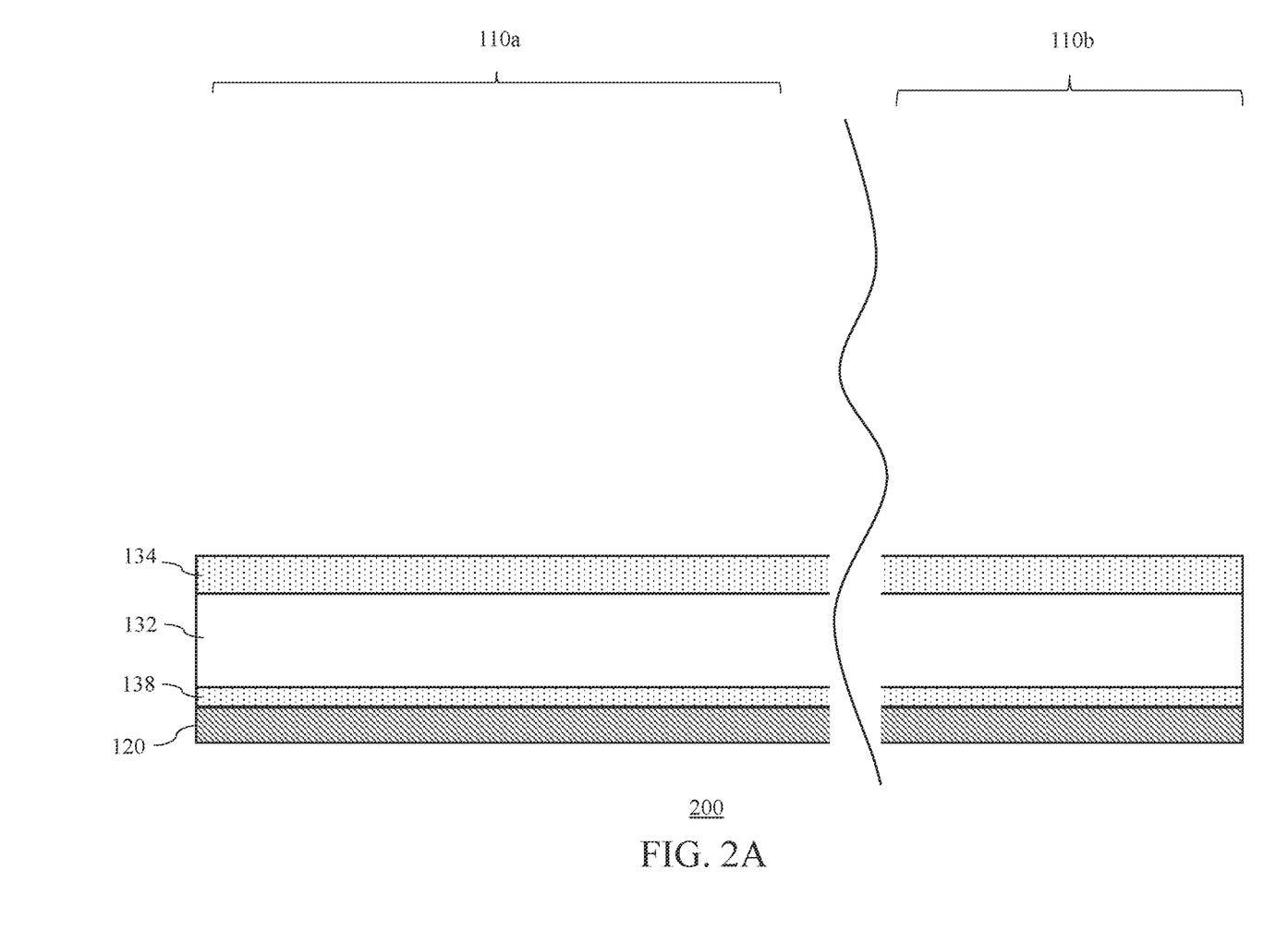
FIGS. 2A-2J show cross-sectional views of an embodiment of a process for forming a device.

Referring to FIG. 2A, the device may be at the stage of processing where at least a portion of a metallization layer has been formed over a substrate in a BEOL processing.

Referring to FIG. 2A, a first conductive element 120 (e.g., metal line $M_x$ disposed in ILD level x) may be formed over the substrate. According to various embodiments, a second etch stop layer 138 may be formed over the first conductive element 120. A first interlevel dielectric layer 132 may be formed over the second etch stop layer 138. An etch stop layer (or first etch stop layer) 134 may be formed on the first interlevel dielectric layer. For example, the second etch stop layer 138, the first interlevel dielectric layer 132, and the etch stop layer 134 may be formed by chemical vapor deposition (CVD). Other techniques may also be useful. In some embodiments, the second etch stop layer 138 is not formed.

Figure 2B:
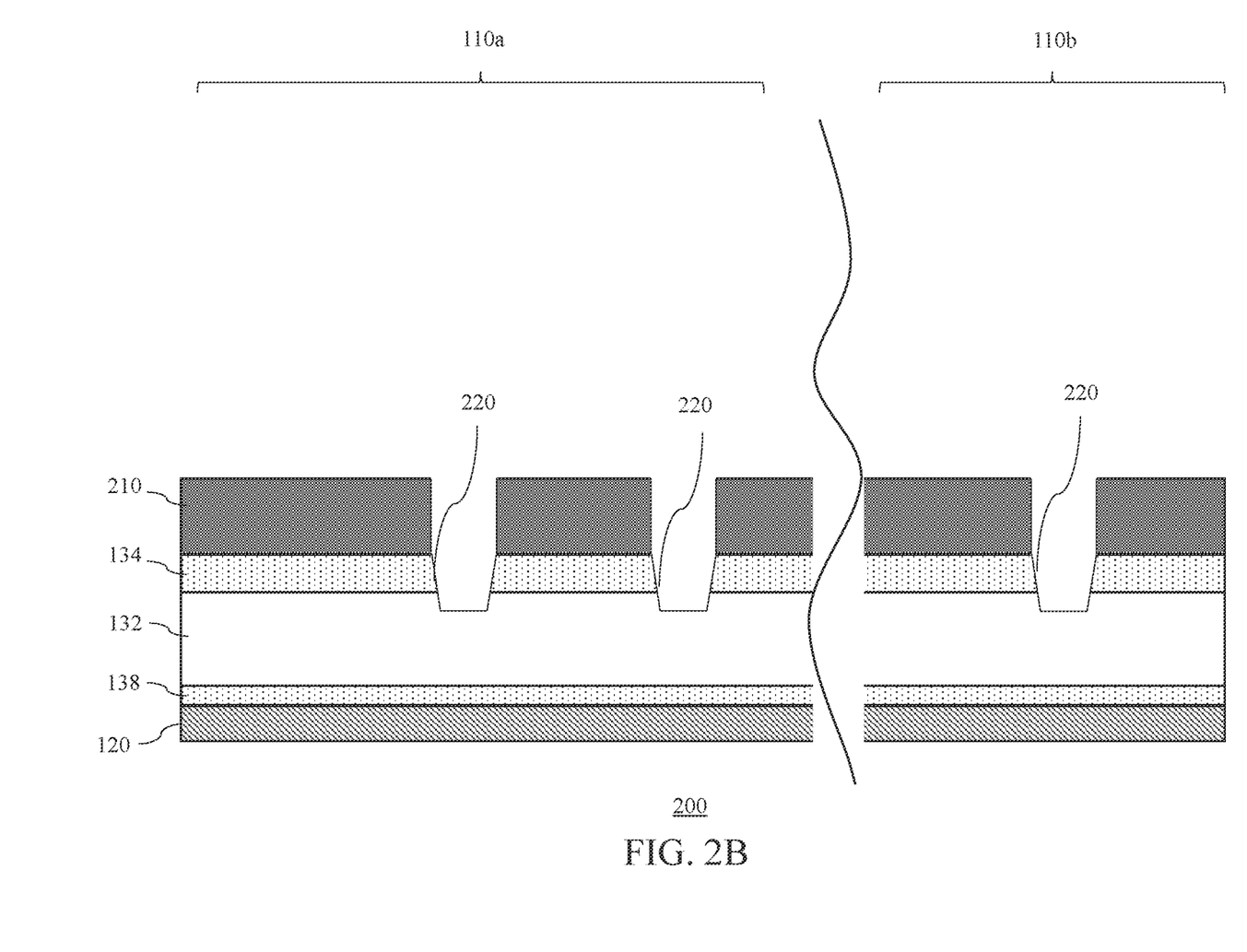

Referring to FIG. 2B, initial via openings 220 may be formed in the etch stop layer 134 and partially in the first interlevel dielectric layer 132, in the first region 110a and the second region 110b. The initial via openings 220 may be formed by mask and etch techniques. For example, a patterned mask 210 such as a photoresist layer may be formed over the etch stop layer 134. For example, a photoresist may be patterned by exposing it with an exposure source using a reticle with the desired pattern. For example, the photoresist layer may be patterned to correspond to a pattern of a via opening of each dual damascene opening to be formed subsequently. After exposure, the photoresist may be developed, transferring the pattern of the reticle to the photoresist. The patterned photoresist may then be used as an etch mask to remove the material of the etch stop layer 134 and partial material of the first interlevel dielectric layer 132 by an etch, forming the initial via openings 220. The patterned mask may be removed, for example, by ashing in the case of a photoresist layer, after forming the initial via openings 220.

A second interlevel dielectric layer 136 may be formed over the etch stop layer 134. For example, the second interlevel dielectric layer 136 may be formed by CVD.

According to various embodiments, the second etch stop layer 138 (when included), the first interlevel dielectric layer 132, the etch stop layer 134 and the second interlevel dielectric layer 136 may be referred to as the interlevel dielectric 130 of the device.

Figure 2C:
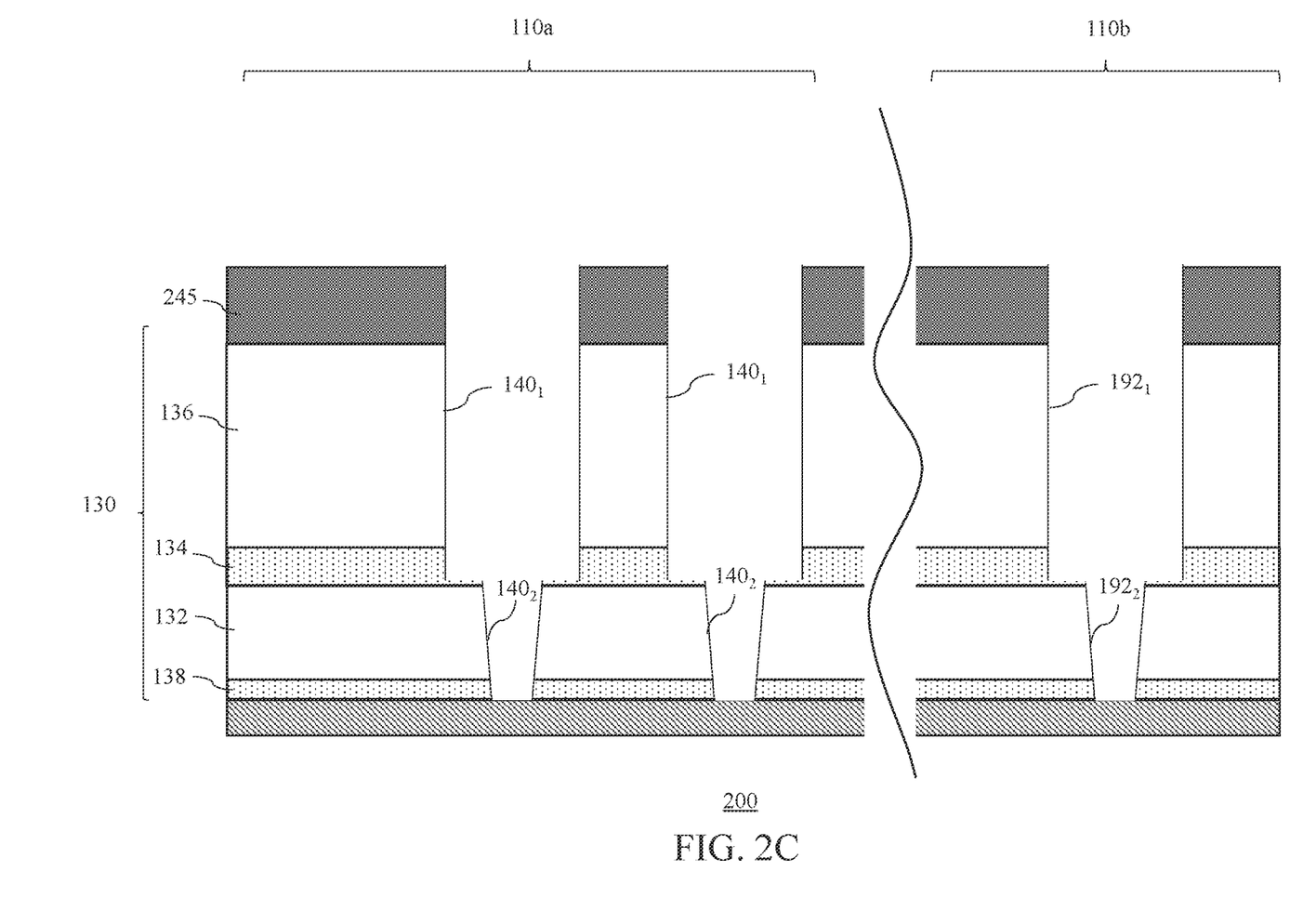

According to various embodiments, at least one dual damascene opening (e.g., first dual damascene opening(s)) 140 may be formed through the interlevel dielectric 130 in the first region 110a, as illustrated in FIG. 2C. A dual damascene opening(s) (e.g., second dual damascene opening(s)) 192 for the logic interconnect may be formed through the interlevel dielectric 130 in the second region 110b. In other words, the dual damascene openings 140, 192 may be formed through the second etch stop layer 138, the first interlevel dielectric layer 132, the etch stop layer 134 and the second interlevel dielectric layer 136. The dual damascene openings 140 in the first region 110a and the dual damascene opening 192 for the logic interconnect in the second region 110b may be formed simultaneously. The dual damascene openings 140, 192 may be formed by mask and etch techniques. For example, a patterned mask 245 such as a photoresist layer may be formed over the second interlevel dielectric layer 136. The photoresist layer may be patterned to correspond to a pattern of a trench opening 1401/1921 of each dual damascene opening 140/192 to be formed. The patterned photoresist may then be used as an etch mask to remove material of the second interlevel dielectric layer 136, the etch stop layer 134, the first interlevel dielectric layer 132, and the second etch stop layer 138, by an etch, forming the dual damascene openings 140, 192. As shown in FIG. 2C, the etch may extend a depth of the initial via openings 220 through the first interlevel dielectric layer 132 and the second etch stop layer 138 to form the via openings 1402 in the first regions and a via opening 1922 in the logic region 110b. The patterned mask may be removed, for example, by ashing in the case of a photoresist layer, after forming the dual damascene openings 140, 192.

Figure 2D:
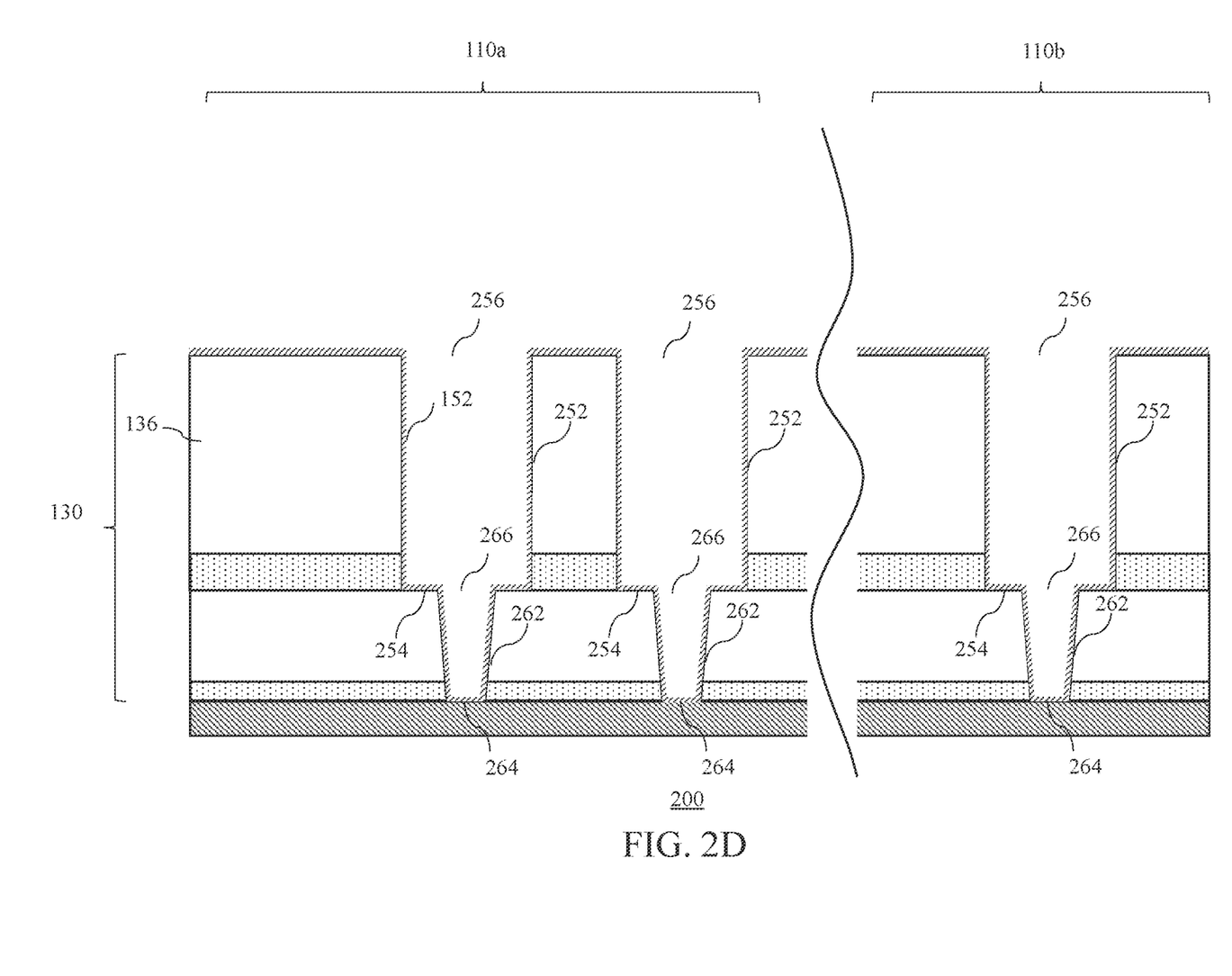

Referring to FIG. 2D, a trench opening 1401/1921 may have a first end (e.g., top) 256, a second end (e.g., bottom) 254, and sidewalls 252 extending between the first and second ends 256, 254. A via opening 1402/1922 may have a first end (e.g., top) 266, a second end (e.g., bottom) 264, and sidewalls 262 extending between the first and second ends 266, 264. The via openings 1402/1922 may extend from the second end or bottom 254 of the respective trench opening 1401/1921. A dual damascene opening 140/190 extends from a first end 256 of a trench opening 1401/1921 to a second end 264 of a via opening 1402/1922. A first conductive liner 152 may be formed over the second interlevel dielectric layer 136 of the interlevel dielectric 130. The first conductive liner 152 may be deposited to a cover a top surface of the second interlevel dielectric layer 136, and line the dual damascene openings 140, 192. As illustrated, the first conductive liner 152 may line sidewalls and the second end of the dual damascene openings 140, 192.

Figure 2E:
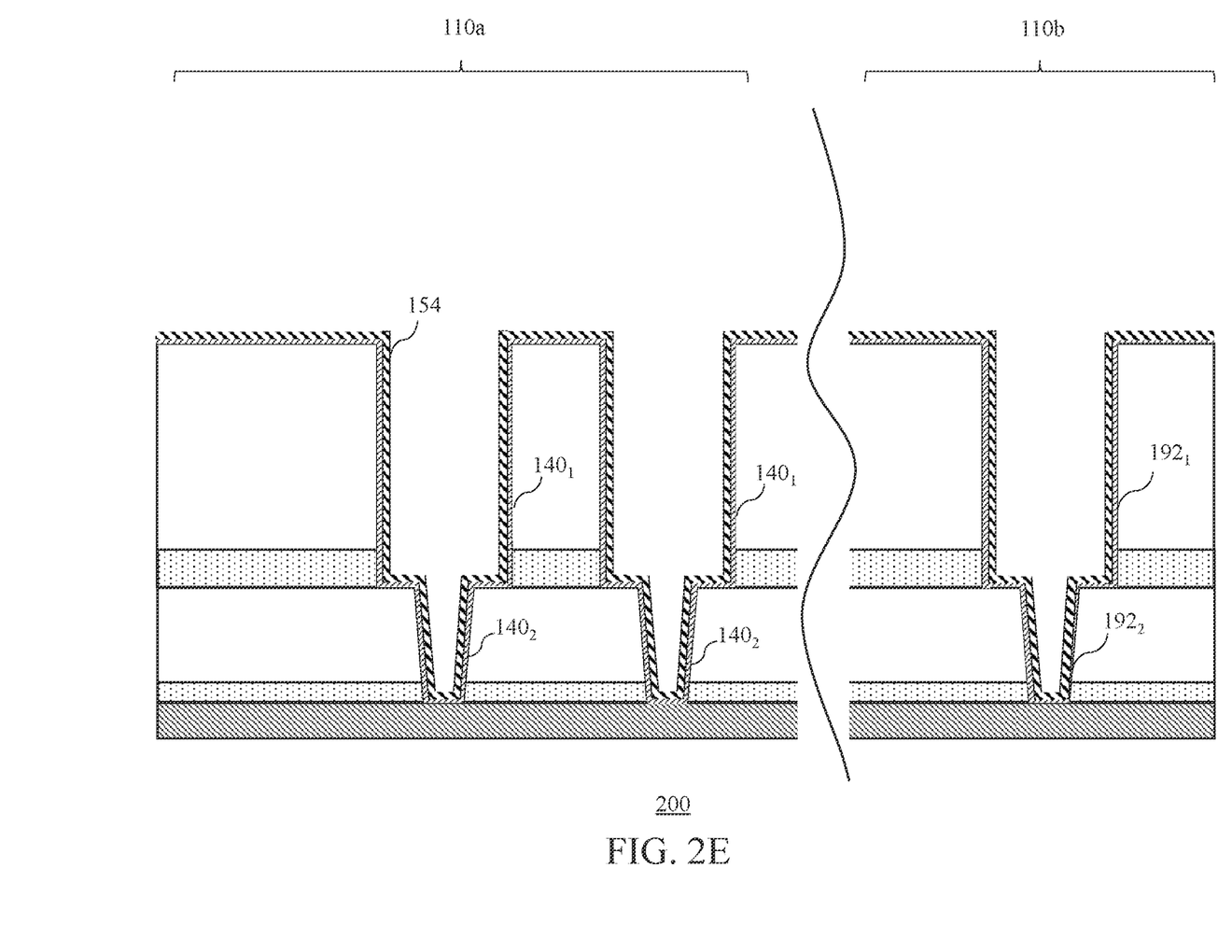

Referring to FIG. 2E, an insulator layer 154 may be formed over the first conductive liner 152. The insulator layer 154 may be formed to line the first conductive liner 152. For example, an insulating material may be deposited over the first dual damascene opening(s) 140 in the first region 110a and the second dual damascene opening 192 in the second region 110b simultaneously. The first conductive liner 152 and the insulator layer 154, for example, may be formed by physical vapor deposition (PVD) or atomic layer deposition (ALD), such as plasma enhanced ALD.

Figure 2F:
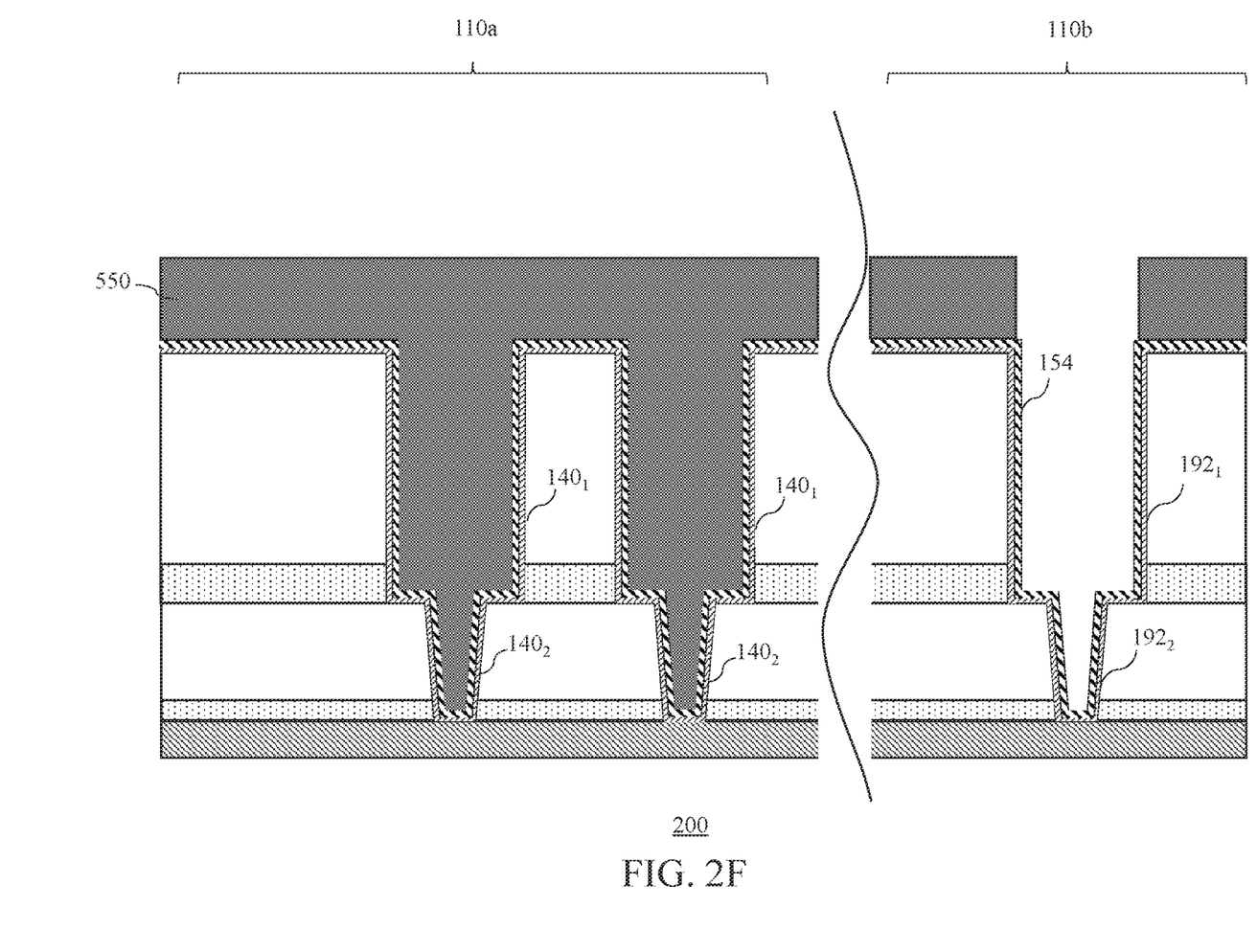

The insulating material may be patterned to remove the insulating material from the second dual damascene opening 192 in the second region 110b. In other words, a portion of the insulator layer 154 in the dual damascene opening 192 in the second region 110b may be removed. For example, the portion of the insulator layer 154 in the dual damascene opening 192 in the second region 110b may be removed by mask and etch techniques. Referring to FIG. 2F, a patterned mask 550 such as a photoresist layer may be formed over the insulator layer 154. For example, the photoresist may be patterned to expose the portion of the insulator layer 154 in the dual damascene opening 192 in the second region 110b. The patterned photoresist may then be used as an etch mask to remove the portion of the insulator layer 154 in the dual damascene opening 192 in the second region 110b by an etch. The patterned mask may be removed, for example, by ashing in the case of a photoresist layer.

Figure 2G:
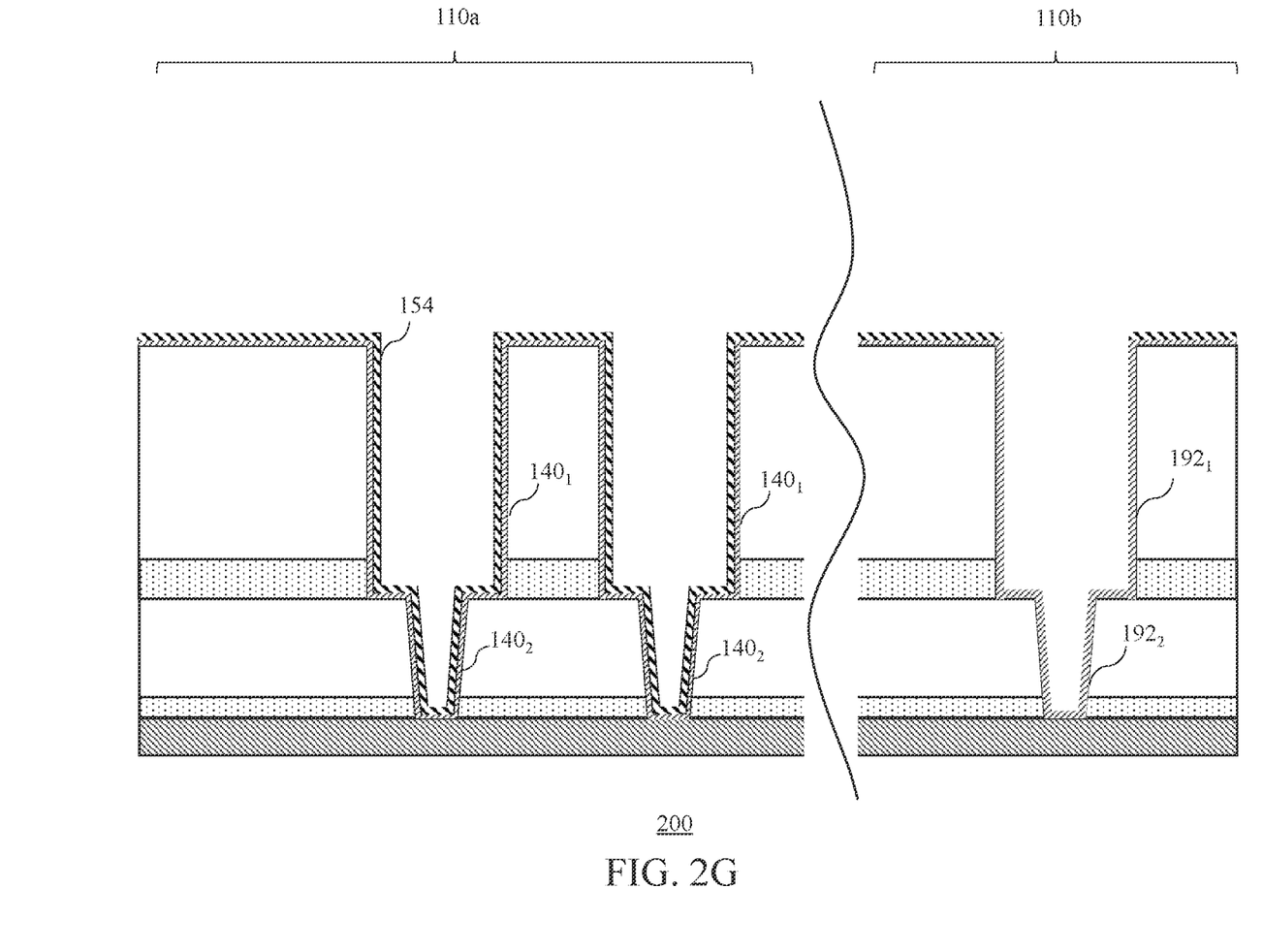

FIG. 2G shows the insulator layer 154 is no longer present (e.g., removed) in the dual damascene opening 192 in the second region 110b, while being still present in the dual damascene opening 140 in the first region 110a.

Figure 2H:
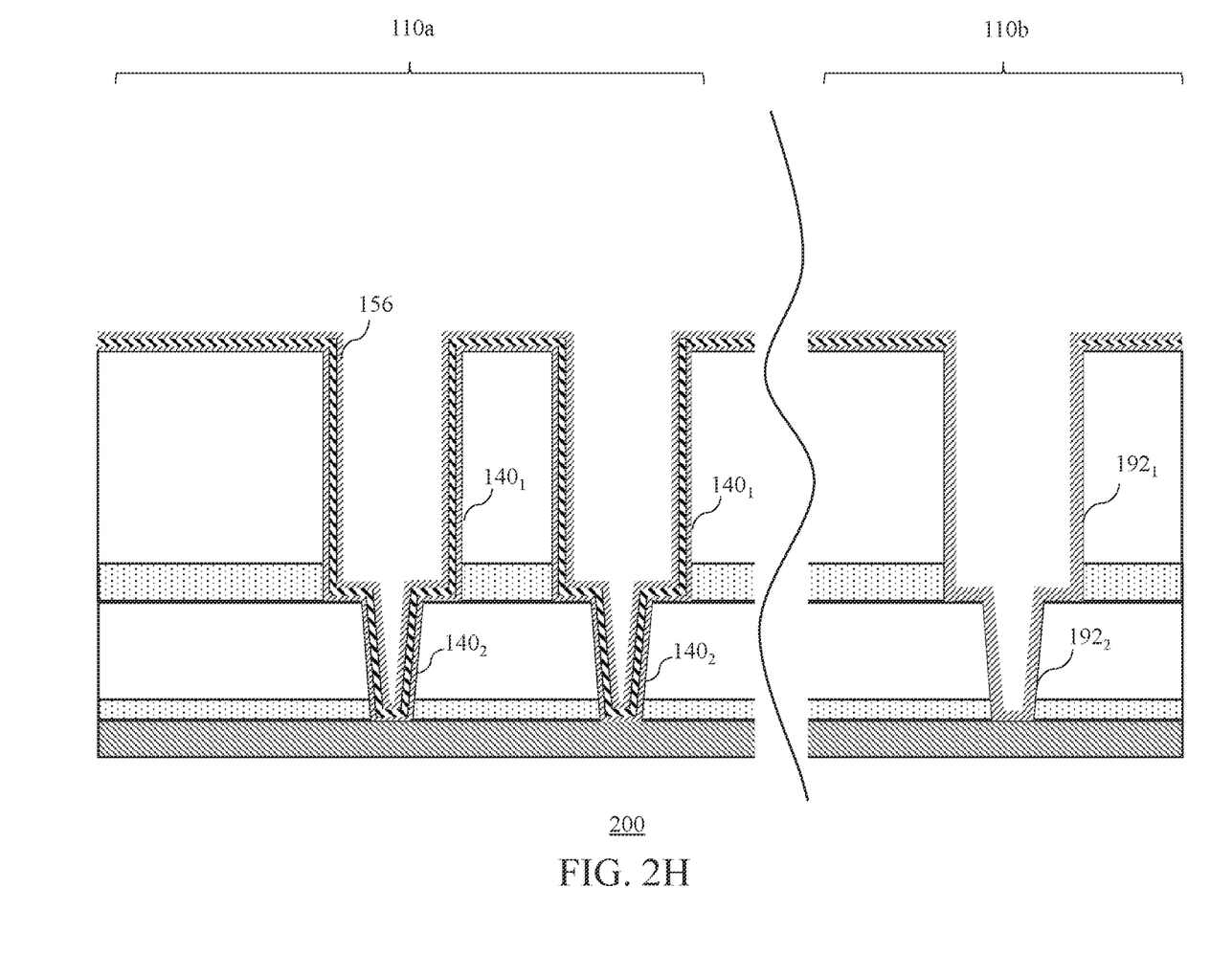

A second conductive liner 156 may be formed in the dual damascene openings 140, 192. The second conductive liner 156 may be formed by CVD, for example. Referring to FIG. 2H, the second conductive liner 156 may line the insulator layer 154 in the dual damascene openings 140 in the first region 110a, and line the first conductive liner 152 in the dual damascene opening 192 in the second region 110b.

Figure 2I:
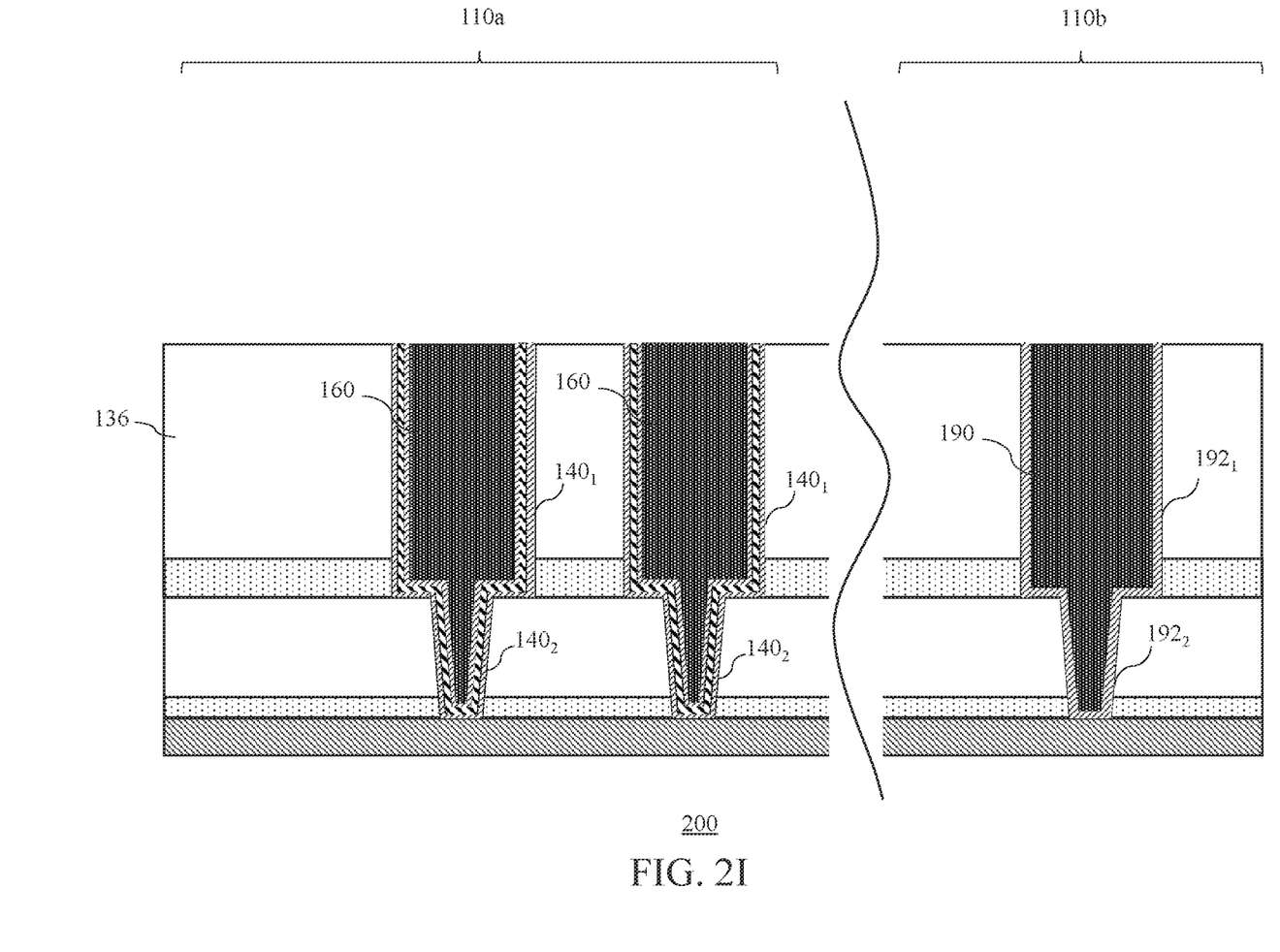

A conductive material may be deposited over the interlevel dielectric 130 to fill the dual damascene openings 140, 192. The conductive material may be formed by plating, in a non-limiting example. A planarization process, such as chemical mechanical polishing, may be performed to remove excess conductive material, forming a respective first metal interconnect 160 in the dual damascene openings 140 in the first region 110a, and a logic interconnect 190 in the dual damascene opening 192 in the second region 110b. The planarization process forms a substantially planar top surface between the first metal interconnects 160, logic interconnect 190 and the second interlevel dielectric layer 136. As shown in FIG. 2I, the planarization process may be performed such that the first metal interconnect(s) 160 and the interlevel dielectric 130 has a substantially planar top surface.

Figure 2J:
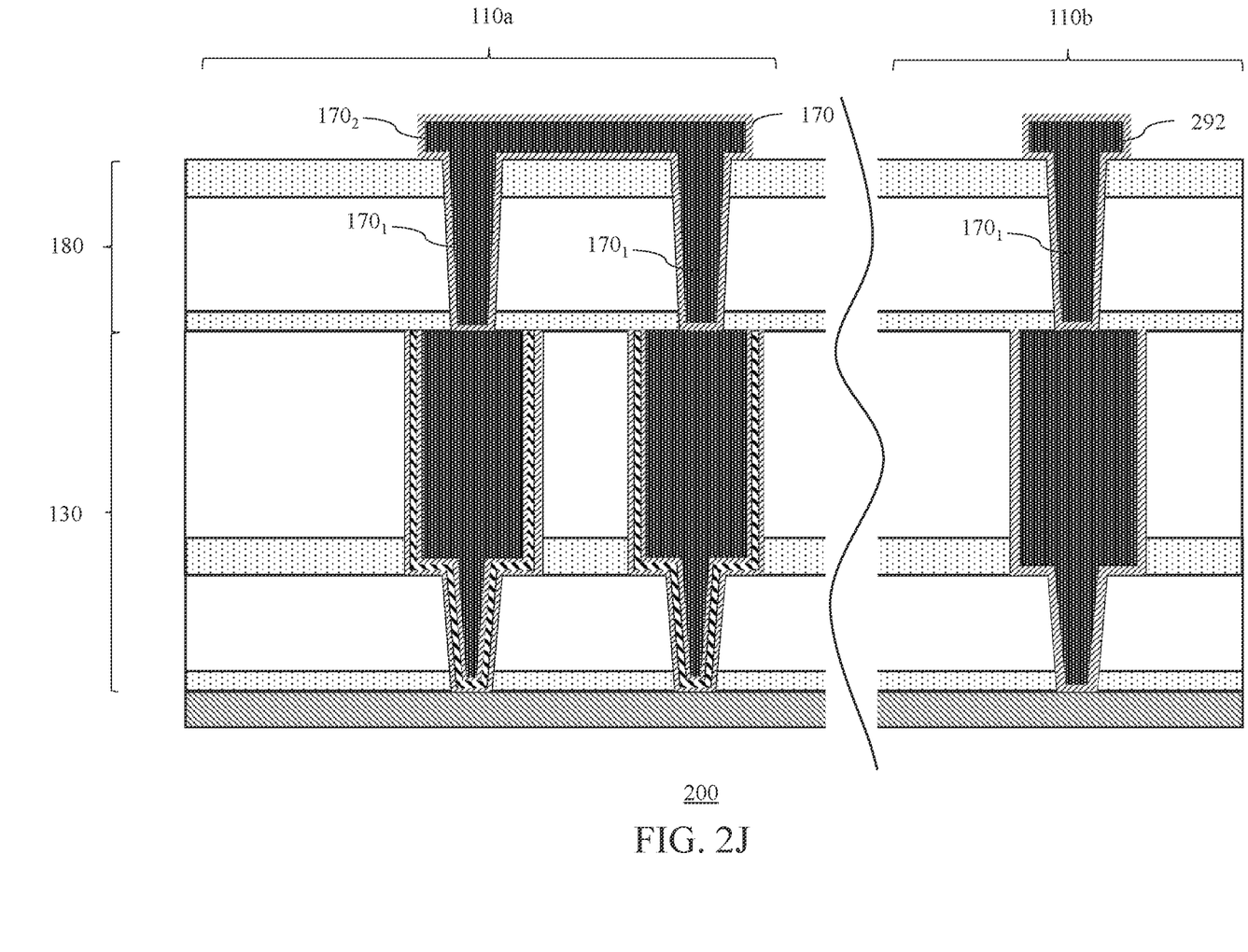

The process may continue to form a second conductive element 170 in the first region 110a, as illustrated in FIG. 2J. According to various embodiments, the second conductive element 170 may include second via contacts 1701 and a second metal line 1702. The second metal line 1702 in the first region 110a may be formed in the same processing step as a further metal line 292 in the second region 110b. For example, a second interlevel dielectric 180 may be formed over the first interlevel dielectric 130 to cover the first metal interconnects 160 in the first region and the logic interconnect in the second region 110b. Second via openings may be formed in the second interlevel dielectric 180 to partially expose a top surface of first metal interconnects 160 in the first region and further via opening may be formed in the second interlevel dielectric 180 to partially expose a top surface of the logic interconnect in the second region 110b. The second via contacts 1701 may be formed in the second via openings and further via contact(s) may be formed in the further via openings. The second metal line 1702 may be formed to cover and contact the second via contacts 1701. In other embodiments, a respective second metal line 1702 may be connected to a respective second via contact 1701. In the case where a single first metal interconnect 160 and MIM stack 150 is formed in the interlevel dielectric 130, the second conductive element 170 may include a single second via contact 1701 and a single second metal line 1702. In other embodiments, the second conductive element 170 may be a single conductive element, such as a contact pad in a non-limiting example, formed over the first metal interconnect 160 and MIM stack 150.

Additional processes may be performed to complete the device. Such processes may include forming additional interconnect metal levels, final passivation, dicing, packaging, testing, etc.

Accordingly, the device having the MIM capacitor(s) may be easily integrated in a dual damascene process. According to various embodiments as described, the process for forming the device having the MIM capacitor(s) does not need additional mask for aligning the MIM stack, and does not require additional etch or clean step for forming the MIM stack. The process requires only one additional mask for removing the portion of the insulator layer in the dual damascene opening in the logic region (second region 110b).

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
   a first conductive element;
   an interlevel dielectric arranged over the first conductive element;
   a dual damascene opening including a first end, a second end, and sidewalls extending between the first and second ends, the sidewalls extending through the interlevel dielectric;
   a metal-insulator-metal (MIM) stack lining the dual damascene opening, wherein the MIM stack comprises a first conductive liner lining the sidewalls and the second end of the dual damascene opening, an insulator layer lining the first conductive liner, and a second conductive liner lining the insulator layer; and
   a first metal interconnect disposed in and filling the dual damascene opening lined with the MIM stack,
   wherein the MIM stack comprises:
   a first lateral portion extending along a length of and within an etch stop layer of the interlevel dielectric, wherein a thickness of the etch stop layer is greater than a thickness of the first lateral portion, and
   a second lateral portion extending along a length of and within a second etch stop layer of the interlevel dielectric, wherein a thickness of the second etch stop layer is greater than a thickness of the second lateral portion.

2. The device of claim 1, wherein the interlevel dielectric comprises a first interlevel dielectric layer, a second interlevel dielectric layer, the etch stop layer, and the second etch stop layer, wherein the first interlevel dielectric layer is disposed on the second etch stop layer, the etch stop layer is disposed on the first interlevel dielectric layer, and the second interlevel dielectric layer is disposed on the etch stop layer, wherein the MIM stack further comprises:
   a first vertical portion extending along a first direction, wherein the first lateral portion extends from the first vertical portion and extends along a second direction that is perpendicular to the first direction;
   a second vertical portion extending from the first lateral portion and extending along a third direction that is oblique relative to the first direction, wherein the second lateral portion extends from the second vertical portion and extends along the second direction.

3. The device of claim 2, wherein the dual damascene opening comprises a trench opening and a via opening, the trench opening extending through the second interlevel dielectric layer and the etch stop layer, and the via opening extending through the first interlevel dielectric layer.

4. The device of claim 3, wherein the first conductive liner, the insulator layer and the second conductive liner are conformal to a topography of the trench opening and the via opening.

5. The device of claim 2, wherein the etch stop layer is formed of a dielectric material having different etch rate with respect to dielectric material of the second interlevel dielectric layer.

6. The device of claim 1, wherein the second end of the dual damascene opening partially exposes a top surface of the first conductive element, and the first conductive liner of the MIM stack covers and directly contacts the top surface of the first conductive element.

7. The device of claim 6, further comprising a second conductive element arranged over the first metal interconnect and electrically coupled to the MIM stack.

8. The device of claim 7, further comprising a second interlevel dielectric arranged over the interlevel dielectric, wherein the second interlevel dielectric surrounds the second conductive element and covers a top surface of the MIM stack.

9. The device of claim 1, wherein the first metal interconnect comprises a trench portion and a via portion.

10. The device of claim 9, wherein the trench portion has a thickness of about 0.9 µm or greater.

11. The device of claim 1, wherein the first metal interconnect and the interlevel dielectric has a substantially planar top surface.

12. The device of claim 1, wherein the dual damascene opening having the MIM stack is disposed in a first region of the interlevel dielectric, and the interlevel dielectric further comprises a second region adjacent to the first region, the interlevel dielectric further comprising a logic interconnect in the second region.

13. The device of claim 12, wherein the first region of the interlevel dielectric comprises a plurality of the dual damascene openings, each respective dual damascene opening having a respective MIM stack and a respective first metal interconnect disposed in the respective dual damascene opening.

14. The device of claim 1, further comprising:
   a second dual damascene opening including a third end, a fourth end, and second sidewalls extending between the third and fourth ends, the second sidewalls extending through the interlevel dielectric;
   a third conductive liner lining the second dual damascene opening;
   a logic interconnect disposed in and filling the second dual damascene opening lined with the third conductive liner,
   wherein the third conductive liner comprises a third lateral portion extending along the length of and within the etch stop layer, wherein the thickness of the etch stop layer is greater than a thickness of the third lateral portion, and wherein the third conductive liner comprises a fourth lateral portion extending along the length of and within the second etch stop layer, wherein the thickness of the second etch stop layer is greater than a thickness of the fourth lateral portion.

15. A method of forming a device, comprising:

providing an interlevel dielectric arranged over a first conductive element;

forming a dual damascene opening through the interlevel dielectric, the dual damascene opening including a first end, a second end, and sidewalls extending between the first and second ends, the sidewalls extending through the interlevel dielectric;

forming a metal-insulator-metal (MIM) stack in the dual damascene opening, wherein forming the MIM stack comprises forming a first conductive liner to line the sidewalls and the second end of the dual damascene opening, forming an insulator layer to line the first conductive liner, and forming a second conductive liner to line the insulator layer; and forming a first metal interconnect in and filling the dual damascene opening lined with the MIM stack, wherein the MIM stack comprises:

a first lateral portion extending along a length of and within an etch stop layer of the interlevel dielectric, wherein a thickness of the etch stop layer is greater than a thickness of the first lateral portion, and a second lateral portion extending along a length of and within a second etch stop layer of the interlevel dielectric, wherein a thickness of the second etch stop layer is greater than a thickness of the second lateral portion.

16. The method of claim 15, wherein the dual damascene opening comprises a trench opening and a via opening, the trench opening extending through the second interlevel dielectric layer and the etch stop layer, and the via opening extending through the first interlevel dielectric layer.

17. The method of claim 16, wherein the first conductive liner, the insulator layer and the second conductive liner are conformal to a topography of the trench opening and the via opening.

18. The method of claim 15, wherein the etch stop layer is formed of a dielectric material having different etch rate with respect to dielectric material of the second interlevel dielectric layer.

19. The method of claim 15, wherein the dual damascene opening having the MIM stack is a first dual damascene opening formed in a first region of the interlevel dielectric, and the method further comprises: forming a second dual damascene opening in a second region of the interlevel dielectric for a logic interconnect, wherein forming the insulator layer to line the first conductive liner comprises depositing an insulating material over the first dual damascene opening in the first region and the second dual damascene opening in the second region simultaneously, and patterning the insulating material to remove the insulating material from the second dual damascene opening in the second region.

20. The method of claim 15, wherein forming the first metal interconnect on the MIM stack comprises depositing a conductive material over the interlevel dielectric and performing a planarization process such that the first metal interconnect and the interlevel dielectric has a substantially planar top surface.

* * * * *